United States Patent [19]

Dobkin

[11] Patent Number: 5,055,711
[45] Date of Patent: Oct. 8, 1991

[54] IMPEDANCE CONTROL CIRCUIT FOR AN INTEGRATED CIRCUIT NODE

[75] Inventor: Robert C. Dobkin, Montesereo, Calif.

[73] Assignee: Linear Technology Corporation, Milpitas, Calif.

[21] Appl. No.: 312,218

[22] Filed: Feb. 21, 1989

[51] Int. Cl.⁵ ............................................ H03K 17/16
[52] U.S. Cl. .................................. 307/362; 307/542; 307/549; 307/567
[58] Field of Search ............... 307/362, 542, 549, 550, 307/557, 567, 568, 490, 491

[56] References Cited

U.S. PATENT DOCUMENTS

| | | | |
|---|---|---|---|
| 3,654,530 | 4/1972 | Lloyd | 307/567 |
| 4,289,977 | 9/1981 | Powers et al. | 307/567 |
| 4,525,637 | 6/1985 | Sano et al. | 307/362 |
| 4,678,950 | 7/1987 | Mitake | 307/550 |
| 4,777,387 | 10/1988 | Collins | 307/549 |

OTHER PUBLICATIONS

A. B. Grebene, *Bipolar and MOS Analog Integrated Circuit Design*, 1984, pp. 135–155.

*Primary Examiner*—John Zazworsky
*Attorney, Agent, or Firm*—Mark D. Rowland

[57] ABSTRACT

The present disclosure is of a novel circuit for controlling the impedance of an integrated circuit node during power-off and transient power conditions. The circuit includes a PNP transistor having an emitter-collector circuit connected between the circuit node and a ground node. The base of the transistor is connected to the ground node by a resistance, which holds the voltage at the base of the PNP transistor near ground potential when a signal is applied to the circuit node. The resistance can be implemented with a pinch resistor or as a FET transistor. The emitter of the PNP transistor clamps the voltage at the node to a value equal to the voltage drop across the resistor plus the forward voltage drop across the emitter-base circuit of the PNP transistor, the sum of which is less than the minimally necessary base-emitter turn-on voltage of a Darlington-connected NPN transistor pair. The forward voltage drop across the emitter-base circuit of the PNP decreases with increasing temperature, thereby reducing the clamp voltage to compensate for the temperature coefficients of the base-emitter junctions of the NPN transistors. When power is applied to the integrated circuit, a current source connected to the base of the PNP transistor generates a current to reverse-bias the emitter-base circuit of the PNP transistor, effectively disconnecting the PNP transistor from the circuit node.

18 Claims, 2 Drawing Sheets

IMPEDANCE CONTROL CIRCUIT FOR AN INTEGRATED CIRCUIT NODE

BACKGROUND OF THE INVENTION

The present invention relates to a circuit for passively controlling the impedance of an integrated circuit node. More particularly, the present invention relates to a circuit for controlling the impedance of an integrated circuit node when the integrated circuit is in a power off condition.

It is desirable in many circumstances that the impedance of a particular node in an integrated circuit (i.e., the impedance of the integrated circuit between the node and a reference point such as ground) be controlled at times when the integrated circuit is not fully powered, such as when no source of power is applied to the power supply terminal of the integrated circuit, or when the integrated circuit is in a transient state immediately following the application or removal of a power source. For example, a system design may require that the output impedance of an integrated circuit line driver or reset circuit connected to an active line remain stable (e.g., low or high) when the line driver or reset circuit is not powered or is in a transient turn-on or turn-off condition.

In some integrated circuit devices, the output impedance of the device during power-off and transient conditions is a function of the impedance of an internal node. In such cases, it is necessary to control the impedance of the internal node during power-off conditions so that the output impedance of the device remains at a desired level. For example, the output stage of a typical integrated circuit device may include an output transistor having its collector connected to the output node of the device and its emitter connected to the ground node of the device, and a capacitor connected across the basecollector circuit of the transistor (e.g., for frequency compensation or to control slew rate). Under power-off conditions, it would be undesirable for the collector-emitter circuit of the transistor to conduct current, but such conduction may happen if, for example, an AC signal is applied to the output node of the device by external circuitry. The output transistor may conduct in this case because the frequency compensation capacitor couples the AC signal to the base of the output transistor and causes the transistor to turn on.

Attempts have been made in the past to control the power-off output impedance of such a circuit under AC signal conditions by including a capacitor or a parallel resistor-capacitor network between the base of the transistor and the ground node to lower the amount of current flowing back to the base of the transistor from the output node. These approaches suffer from several drawbacks. For example, if a capacitor alone is used, the charge build-up in the capacitor resulting from its conduction of current away from the base of the transistor may interfere with normal operation of the device during power-on conditions. If a parallel resistor is added to discharge the capacitor, the resistor not only must have a high resistance value to prevent it from interfering with normal circuit operation during power-on conditions, but must also be capable of conducting the potentially large discharge current of the capacitor. Such a resistor requires a large die area and thus is costly in terms of the space on an integrated circuit die which must be sacrificed to implement the resistor.

Another drawback is that the capacitor and the resistor-capacitor network do not compensate for the effect of increasing temperature on the transistor base-emitter turn-on voltage. As the operating temperature of the device increases, the base-emitter voltage required to turn on the transistor decreases. However, the degree to which the capacitor or the resistor-capacitor network connected across the base-emitter circuit attenuates an AC signal coupled to the base of the transistor does not increase with temperature. Thus at high operating temperatures the prior art capacitor and capacitor-resistor network become less effective at preventing the transistor from conducting current in response to an AC signal applied to the output node of the device, and therefore become less effective at controlling the output impedance of the device.

In discrete circuits, the problem of creating a low impedance node during power-off conditions has been solved by using a depletion-mode FET transistor to create a low impedance current path between the node and ground. During power-on conditions, a bias voltage is applied to the gate of the FET transistor which causes a depletion of the normally existing conducting channel. It would be desirable, however, to implement a circuit for controlling the impedance of an integrated circuit node in a monolithic integrated circuit.

SUMMARY OF THE INVENTION

The present invention is a novel circuit for controlling the impedance of an integrated circuit node during power-off and transient power conditions. The circuit includes a PNP transistor having an emitter-collector circuit connected between the circuit node and a ground node. The base of the transistor is connected to the ground node by a resistor, which holds the voltage at the base of the PNP transistor near ground potential when power is off. The emitter of the PNP transistor clamps the voltage at the node to a value equal to the voltage drop across the resistor plus the forward voltage drop across the emitter-base circuit of the PNP transistor, the sum of which is less than the minimally necessary base-emitter turn-on voltage of a Darlington-connected NPN transistor pair. The forward voltage drop across the emitter-base circuit of the PNP decreases with increasing temperature, thereby reducing the clamp voltage to compensate for the temperature coefficients of the base-emitter junctions of the NPN transistors. When power is applied to the integrated circuit, a current source connected to the base of the PNP transistor generates a current to reverse-bias the emitter-base circuit of the PNP transistor, effectively disconnecting the PNP transistor from the circuit node.

The present invention thus provides a novel impedance control circuit for an integrated circuit node which operates without need for a separate power source. The impedance control circuit is effective at high operating temperatures, implementable using a small die area in an integrated circuit device, and operable in a manner which does not interfere during power-on conditions with the normal operation of other circuitry connected to the node.

BRIEF DESCRIPTION OF THE DRAWINGS

The above and other advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
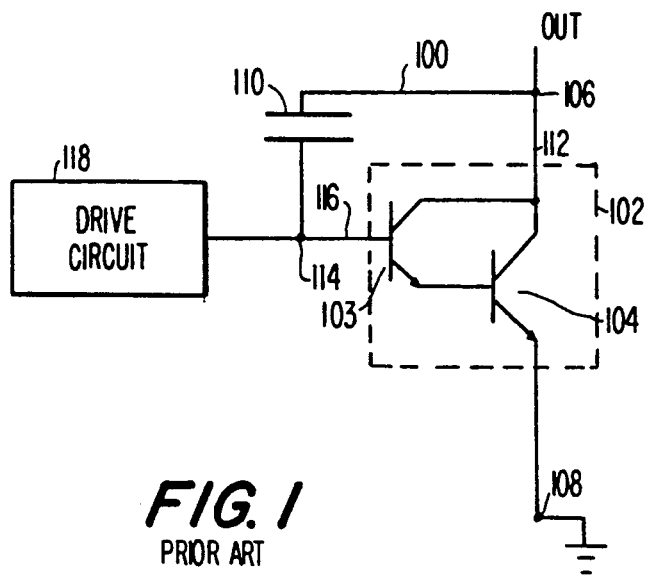
FIG. 1 is a schematic of a conventional output stage circuit.

Referring to FIG. 1, conventional output stage 100 is of a type commonly used in integrated circuit devices. Output stage 100 includes Darlington NPN transistor pair 102 comprising NPN transistors 103 and 104 for conducting current between output node 106 and ground node 108. In an integrated circuit device, output node 106 and ground node 108 may, for example, be connected respectively to the output and ground terminals of the device, such terminals being adapted for connection to external components.

Output stage 100 further includes capacitor 110, one end of which is connected at output node 106 to collector 112 of Darlington pair 102. The other end of capacitor 110 is connected at node 114 to base 116 of Darlington pair 102 and to drive circuit 118. Drive circuit 118 is a conventional or other circuit for providing a drive signal to the base 116 of Darlington pair 102 during power-on conditions to control current conduction between output node 106 and ground node 108.

During power-off conditions, drive circuit 118 does not provide a drive signal to base 116 of Darlington pair 102, and typically exhibits a substantially higher output impedance than the combined impedances (at node 114) of capacitor 110 and base 116 of Darlington pair 102. As a consequence, drive circuit 118 does not substantially affect the impedance of, and is effectively disconnected from, node 114 during power-off conditions.

The output impedance of output stage 100 at output node 106 during power-off conditions is a function of the combined impedances of capacitor 110 and collector 112 of Darlington pair 102. Under DC signal conditions (i.e., circuitry connected to output stage 100 causes a DC voltage to be applied to output stage 100 between output node 106 and ground node 108), both capacitor 110 and collector 112 of Darlington pair 102 exhibit high impedances, such that no substantial current is conducted either by the capacitor or the Darlington pair.

Under AC signal conditions, however, capacitor 110 exhibits an impedance which is a function of its capacitance and the frequency of the AC signal, and will conduct current between output node 106 and node 114. Capacitor 110 thus operates to couple AC signals from output node 106 to node 114 during power-off conditions. Because the high output impedance of drive circuit 118 effectively causes it to be disconnected from node 114, the AC signals are coupled through node 114 to base 116 of Darlington pair 102, and may provide sufficient drive to Darlington pair 102 to cause it to turn on and to conduct current between output node 106 and ground node 108. The current gain of Darlington pair 102 thus will cause output stage 100 to amplify the AC signal applied between output node 106 and ground node 108, and to exhibit an undesirably low output impedance under AC conditions.

Figure 2:
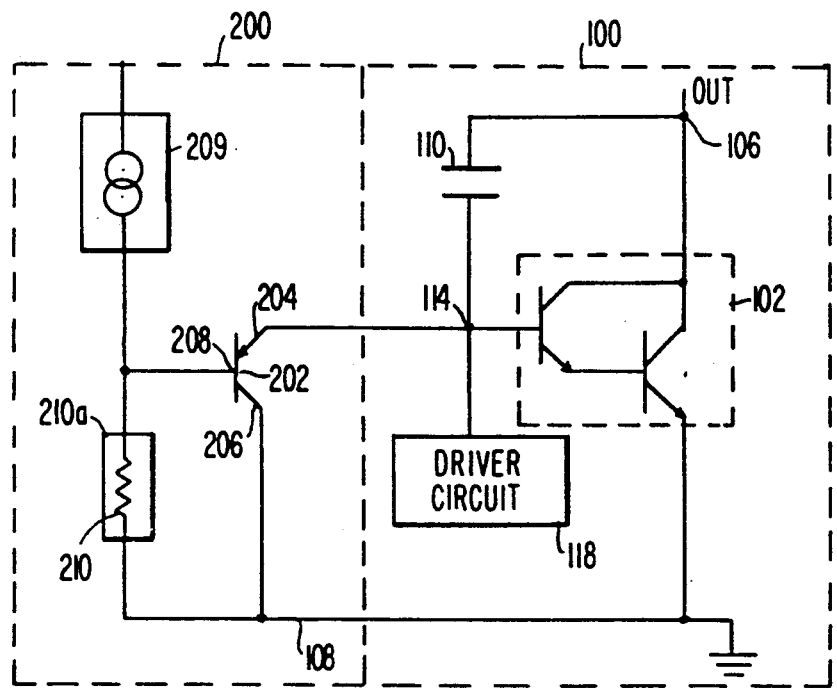
FIG. 2 is a schematic of the circuit of FIG. 1 incorporating an embodiment of the impedance control circuit of the present invention.

FIG. 2 shows an embodiment 200 of applicant's power-off impedance control circuit connected to output stage 100 of FIG. 1. The power-off impedance control circuit 200 includes PNP transistor 202 having an emitter 204 connected to node 114 and a collector 206 connected to ground node 108. A current source 209 is connected between the base 208 of PNP transistor 202 and a power supply in the integrated circuit, such as a voltage supply rail (not shown). Base 208 and current source 209 are also connected to one end of resistor 210, the other end of which is connected to ground node 108.

Stated simply, the current gain of PNP transistor 202 controls the impedance of node 114 during power-off conditions to prevent Darlington transistor pair 102 from conducting. When a positive going AC signal is applied to output node 106 and is coupled to node 114 by capacitor 110, the increasing voltage appearing at node 114 creates a forward bias across the emitter-base junction of PNP transistor 202, causing base 208 of the transistor to conduct a small current. Current source 209, which may be a conventional constant current source or other circuit for supplying current, remains off during power-off conditions because the integrated circuit is unpowered. Thus current conducted by base 208 flows through resistor 210, which clamps base 208 to a voltage close to the voltage of ground node 108. As a result, PNP transistor 202 will turn on when the voltage at its emitter 204 (i.e., node 114) is only slightly greater than the emitter-base voltage necessary to drive the emitter-collector circuit of PNP transistor 202 into a conducting state (e.g., approximately 0.6–0.7V at 25° C.). This voltage is below the voltage necessary to cause Darlington pair 102 to conduct (e.g., 1.4V at 25° C.), such that PNP transistor 202 turns on before the AC signal at node 114 rises to a value sufficient to turn on Darlington pair 102.

Although the minimum voltage necessary to turn on Darlington pair 102 has a temperature coefficient of approximately −4mV/ C., temperature compensation is provided by PNP transistor 202, whose minimum turn-on voltage has a temperature coefficient of −2mV/ C. Thus with increasing temperature the clamp voltage approaches the minimum turn-on voltage of Darlington pair 102 at a rate equal to the difference between the two temperature coefficients. At this rate, however, the clamp voltage will not reach the minimum turn-on voltage of Darlington pair 102.

The emitter-collector circuit of PNP transistor 202 thus provides a low impedance current path between node 114 and ground node 108, in response to an AC signal at node 114, which clamps the voltage at node 114 to a value below the turn-on voltage of Darlington pair 102. This current path shunts current conducted by capacitor 110 away from base 116 of Darlington pair 102 and maintains Darlington pair 102 in a non-conducting state during power-off conditions. Because of the current gain of PNP transistor 202, only a small current must be conducted by resistor 210 to cause the emitter-collector circuit of PNP transistor 202 to conduct current in response to the AC signal at its emitter. Thus resistor 210 need not be capable of conducting the full discharge current of capacitor 110, and the base of PNP transistor 202 is maintained at a voltage close to ground potential.

During power-on conditions, current source 209 conducts current to base 208 and resistor 210 which raises the voltage at the base of the PNP transistor sufficiently high to reverse-bias its emitter-base junction. This effectively disconnects PNP transistor 202 from node 114 and permits drive circuit 118 to control Darlington pair 102 during power-on conditions.

In a typical integrated circuit implementation of the impedance control circuit of FIG. 2, a substrate PNP transistor can be used for PNP transistor 202, and a high-value pinch resistor can be used for resistor 210. The value of the pinch resistor need not be precisely controlled, because its value is not critical to the operation of the circuit. For example, the resistor can be in the range of 25,000–100,000 ohms. Higher resistance values can be used if desired to increase the voltage at which node 114 is clamped. The pinch resistor can be implemented in a small die area without requiring special processing steps, and is therefore well-suited for use in an integrated circuit implementation of power-off impedance control circuit 200. Alternatively, other conductive means that remains conductive without the application of power to the integrated circuit, such as an FET transistor, can be used in place of the pinch resistor to provide a current conductive resistive path between the base of transistor 202 and ground node 108, as represented by box 210a of FIG. 2.

In accordance with the principles of the invention, an embodiment of the power-off impedance control circuit can also be used directly to control the impedance of the output node of a conventional output stage circuit during power-off and transient conditions. An example of this type of embodiment is shown in FIG. 3.

Figure 3:
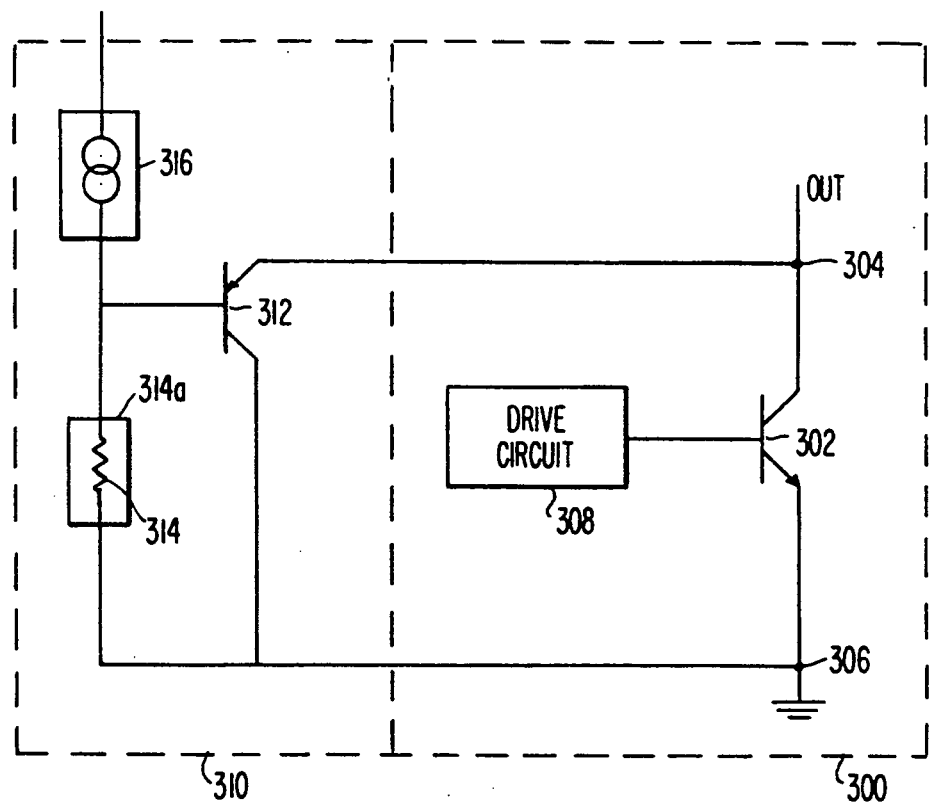
FIG. 3 is a schematic of an output stage circuit incorporating another embodiment of the impedance control circuit of the present invention.

FIG. 3 shows a simplified schematic of a conventional output stage 300 comprising an NPN transistor 302 connected to conduct current between output node 304 and ground node 306 in response to a drive signal from drive circuit 308 connected to its base. The collector of transistor 302 is connected to output node 304 and its emitter is connected to ground node 306. During power-off conditions, the DC and AC impedance of output node 304 (with reference to ground node 306) is ordinarily a function of the impedance of the collector of NPN transistor 302, which is relatively high when no drive signal is provided to the transistor's base.

Power-off impedance circuit 310, similar to the power-off impedance control circuit 200 of FIG. 2, includes a PNP transistor 312, a resistor 314 and a current source 316. As described in greater detail below, the current gain of PNP transistor 312 operates to lower the impedance of output node 304 when an external AC or DC signal above a threshold value is applied between output node 304 and ground node 306.

The emitter-collector circuit of PNP transistor 312 is connected between output node 304 and ground node 306, and its base is connected to ground node 306 by resistor 314. When a voltage signal having a threshold value slightly greater (to account for the voltage generated across resistor 314 by current conducted by the base of PNP transistor 312) than the minimal emitter-base forward bias voltage necessary to turn on PNP transistor 312 appears at the emitter of PNP transistor 312, the emitter-collector circuit of PNP transistor 312 conducts current between output node 304 and ground node 306. When PNP transistor 312 is turned on in this manner, the voltage at output node 304 is clamped at a voltage slightly greater than the forward-bias voltage across the emitter-base junction of PNP transistor 312. Thus, because of the current gain of PNP transistor 312, a low impedance current path is created between output node 304 and ground node 306 by the small current conducted by resistor 314 and the base of PNP transistor 312. This current path, created when a DC or AC signal above a threshold value is applied to output node 304, lowers the impedance of the output node, and therefore can be used to control the output impedance of an integrated circuit device.

During power-off conditions, current source 316, connected between a power supply in the circuitry of the integrated circuit (not shown) and the base of PNP transistor 312 and one end of resistor 314, does not conduct current. On the contrary, during power-on conditions, current source 316 conducts sufficient current to the base of PNP transistor 312 and to resistor 314 to cause PNP transistor 312 to become reverse-baised. Thus PNP transistor 312 is effectively disconnected from the output stage circuit during power-on conditions.

Current source 316 can be implemented as a conventional constant current source or other circuit for providing current. In an integrated circuit implementation, PNP transistor 312 can be implemented as a substrate PNP transistor, and resistor 314 can be implemented as a pinch resistor having a value of 25,000–100,000 ohms, or by other conductive means that remains conductive without the application of power to the integrated circuit, such as a FET transistor, as represented by box 314a of FIG. 3.

The above-described embodiments can be adapted to control the impedance of a circuit node during transient power conditions as well as during power-off conditions. For example, the power-off impedance control circuit can be used to control the output impedance of an integrated circuit device during turn-on of the integrated circuit. In such a case, the current source used to reverse bias the PNP transistor of the output impedance control circuit can be adapted to be controlled by conventional circuitry in the integrated circuit such that the impedance control circuit is not effectively disconnected from the circuit node until a predetermined time after the integrated circuit has achieved a stable power-on condition.

The integrated circuits shown in the figures have been simplified for purposes of illustration, and thus depict only the output stage portions of larger circuits, the details of which are not relevant to a discussion of the principles and operation of the impedance control circuit of the present invention. With respect to the larger circuits, it is sufficient to note that, as is apparent from the figures and the accompanying text above, the impedance control circuit of the present invention can be implemented in a variety of integrated circuit devices including, but not limited to, such device types as line drivers, reset circuits and operational amplifiers, and is not limited to use in the output stage of such devices, but may be used to control the impedance of internal and external nodes elsewhere in the devices.

Thus, a novel circuit for controlling the impedance of a node in an integrated circuit during power-off and transient power conditions has been described. The embodiments of the present invention are described herein for the purposes of illustration and not of limitation, and the present invention is limited only by the claims that follow.

What is claimed is:

1. In an integrated circuit including a first transistor having a collector-emitter circuit connected for conducting a current between a first node and a second node when the integrated circuit is in a power-on condition, a circuit for directly controlling impedance between the first and second nodes when the integrated circuit is in a power-off or transient power condition, the circuit comprising:

first means connected between the first and second nodes, and to a third node, for conducting a current between the first and second nodes which bypasses the collector-emitter circuit of the first transistor when a voltage differential above a predetermined value is developed between the first and third nodes; and second means connected to the third node for generating a voltage at the third node when the integrated circuit is in a power-on condition to prevent the first means from conducting current between the first and second nodes.

2. The circuit of claim 1, wherein the first means comprises a PNP transistor.

3. The circuit of claim 2, wherein the PNP transistor includes an emitter-base junction coupled to the first and third nodes, and an emitter-collector circuit coupled to the first and second nodes.

4. The circuit of claim 1, wherein the first means comprises a transistor of opposite polarity to the first transistor.

5. The circuit of claim 1, wherein the second means includes a resistive means coupled between the third and second nodes and a current source connected to conduct current to the third node when the integrated circuit is in a power-on condition.

6. The circuit of claim 3, wherein the second means prevents the PNP transistor from conducting current by reverse biasing the emitter-base junction of the PNP transistor.

7. The circuit of claim 5, wherein the resistive means comprises a pinch resistor.

8. The circuit of claim 5, wherein the resistive means comprises a transistor connected to provide a current path between the second and third nodes.

9. In an integrated circuit having power-on, power-off and transient power conditions and including a first transistor having a collector-emitter circuit connected to conduct current between a first node and a second node, the integrated circuit further including a third node adapted to receive a drive signal for controlling the current conducted by the collector-emitter circuit of the first transistor, and a signal path which is capable of coupling an A.C. signal from the first node to the third node to create a voltage differential between the second and third nodes sufficient to turn on the first transistor, a circuit for preventing the first transistor from turning on in response to the voltage differential, the circuit comprising:

a second transistor having an emitter-collector circuit connected to conduct current between the third and second nodes in response to the voltage differential to prevent the first transistor from turning on when the integrated circuit is in a power-off or transient power condition;

a resistive means connected to conduct current between the base of the second transistor and the second node; and a current source connected to develop a voltage across the resistive means sufficient to reverse bias the emitter-base junction of the second transistor when the integrated circuit is in the power-on condition, said voltage being developed separate from the drive signal for the first transistor.

10. The circuit of claim 9, wherein the second transistor is a PNP transistor.

11. The circuit of claim 9, wherein the resistive means comprises a pinch resistor.

12. The circuit of claim 9, wherein the resistive means comprises a FET transistor.

13. The circuit of claim 9, wherein the first and second nodes are connected respectively to output and ground terminals of the integrated circuit.

14. In an integrated circuit having power-on, power-off and transient power conditions, and including a first transistor having a collector-emitter circuit connected to conduct current between a first node and a second node in response to a control signal applied to the first transistor when the integrated circuit is in a power-on condition, a circuit for lowering impedance between the first and second nodes when the integrated circuit is in a power-off or transient power condition and a voltage differential is applied to the first and second nodes, the circuit comprising:

a second transistor having an emitter-collector circuit connected to conduct current between the first and second nodes in response to the voltage differential when the integrated circuit is in a power-off or transient power condition, said current bypassing the collector-emitter circuit of the first transistor;

a resistive means connected to conduct current between the base of the second transistor and the second node; and a current source connected to develop a voltage across the resistive means sufficient to reverse bias the emitter-base junction of the second transistor when the integrated circuit is in the power-on condition.

15. The circuit of claim 14, wherein the second transistor is a PNP transistor.

16. The circuit of claim 14, wherein the resistive means comprises a pinch resistor.

17. The circuit of claim 14, wherein the resistive means comprises a FET transistor.

18. The circuit of claim 14, wherein the first and second nodes are connected respectively to output and ground terminals of the integrated circuit.

* * * * *